United States Patent
Storbeck et al.

(10) Patent No.: US 9,698,292 B2
(45) Date of Patent: Jul. 4, 2017

(54) TABBING RIBBON AND PHOTOVOLTAIC SOLAR PANEL

(75) Inventors: Olaf Storbeck, Dresden (DE); Harald Hahn, Dresden (DE)

(73) Assignee: SOLARWORLD INNOVATIONS GMBH, Freiberg (DE)

( * ) Notice: Subject to any disclaimer, the term of this patent is extended or adjusted under 35 U.S.C. 154(b) by 1147 days.

(21) Appl. No.: 13/326,364

(22) Filed: Dec. 15, 2011

(65) Prior Publication Data

US 2012/0152304 A1    Jun. 21, 2012

(30) Foreign Application Priority Data

Dec. 16, 2010   (EP) .................................... 10195378

(51) Int. Cl.
  *H01L 31/05*   (2014.01)
  *B21D 13/04*   (2006.01)
  *H01L 31/054*  (2014.01)

(52) U.S. Cl.
  CPC .......... *H01L 31/0508* (2013.01); *B21D 13/04* (2013.01); *H01L 31/0547* (2014.12); *Y02E 10/52* (2013.01); *Y10T 29/532* (2015.01)

(58) Field of Classification Search
  USPC .............. 136/244–265; 29/745; 72/179, 362; 425/340
  See application file for complete search history.

(56) References Cited

U.S. PATENT DOCUMENTS

| | | | |
|---|---|---|---|
| 4,301,322 | A | 11/1981 | Amick |
| 5,158,618 | A | 10/1992 | Rubin et al. |
| 2004/0173601 | A1 | 9/2004 | Lutz |
| 2005/0230033 | A1 | 10/2005 | Faehrrolfes et al. |
| 2007/0125415 | A1 | 6/2007 | Sachs |
| 2009/0145479 | A1 | 6/2009 | Williams |
| 2010/0108123 | A1 | 5/2010 | Åsberg et al. |

FOREIGN PATENT DOCUMENTS

| | | |
|---|---|---|
| JP | 2005302902 A | 10/2005 |
| JP | 2009130118 A | 6/2009 |
| WO | 2006137746 A1 | 12/2006 |

OTHER PUBLICATIONS

English abstract of JP 2009130118 A.
Office Action from the European Patent Office for Application No. 10 195 378.4 dated Dec. 23, 2014 6 pages.

*Primary Examiner* — Matthew Martin
*Assistant Examiner* — Kourtney Carlson
(74) *Attorney, Agent, or Firm* — Viering, Jentschura & Partner mbB

(57) ABSTRACT

In various embodiments, a tabbing ribbon for connecting at least one solar cell is provided, wherein the tabbing ribbon at least partially extends in a non-planar manner and includes a non-planar section.

10 Claims, 10 Drawing Sheets

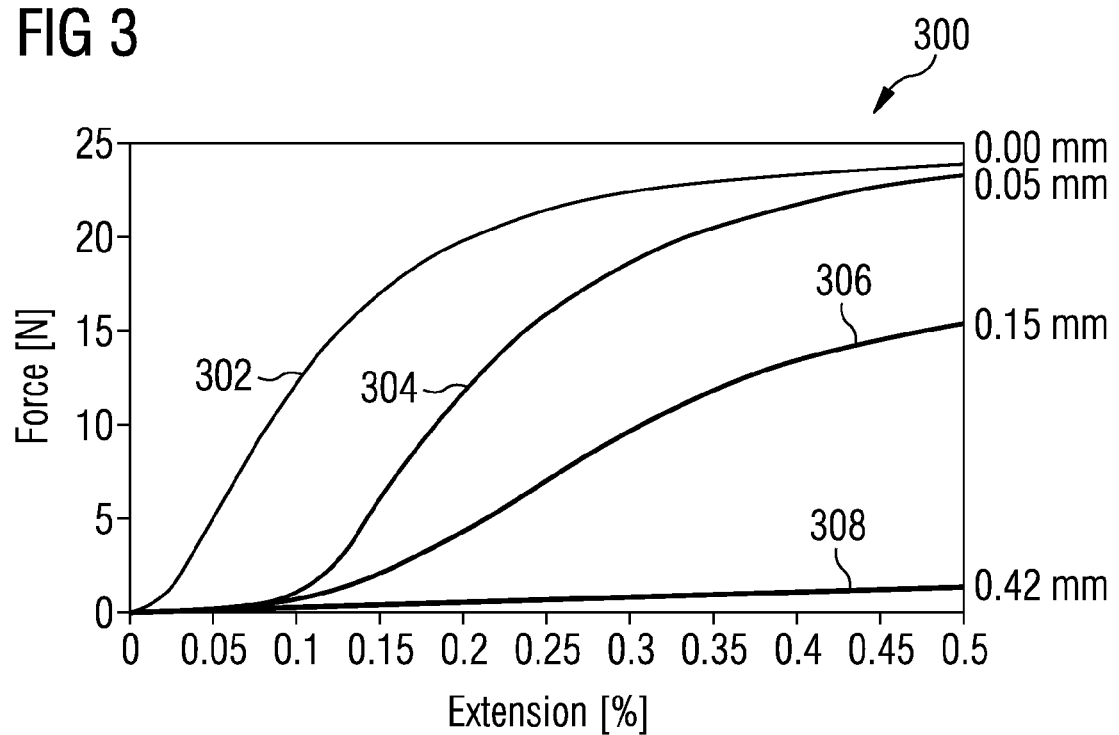

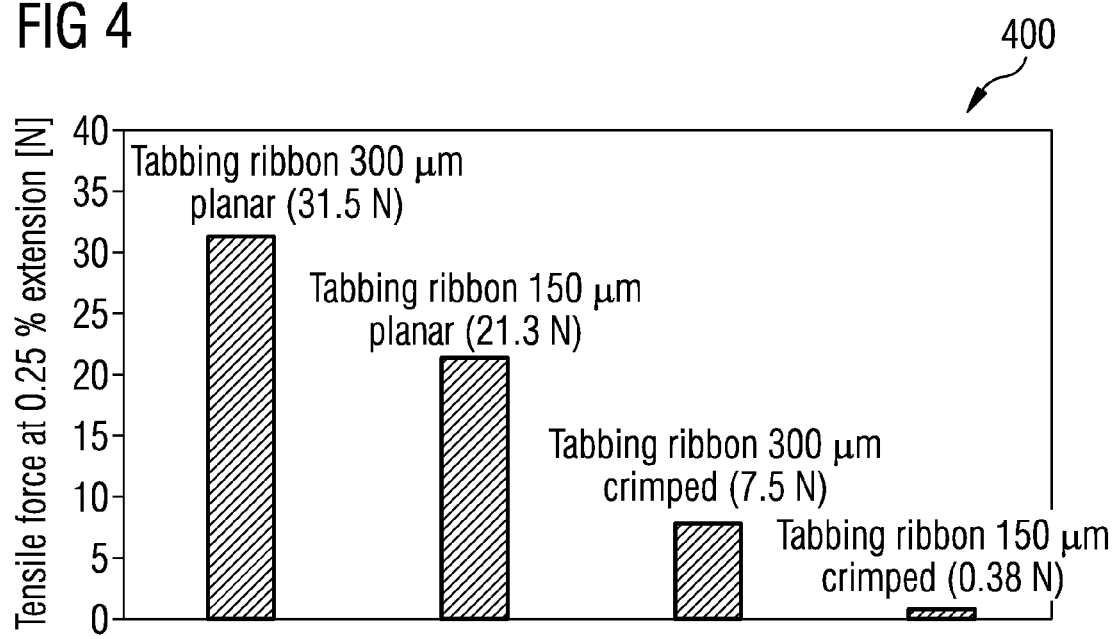

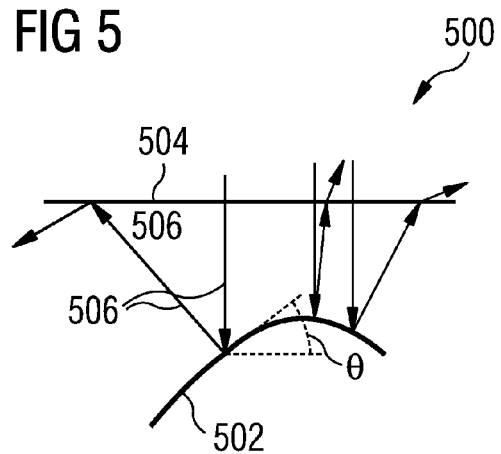
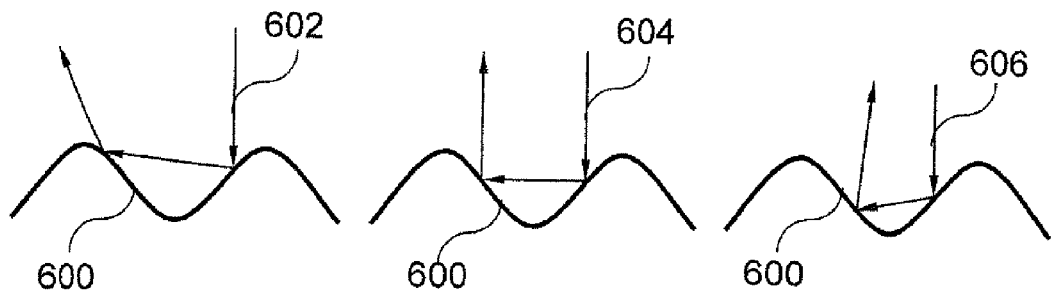

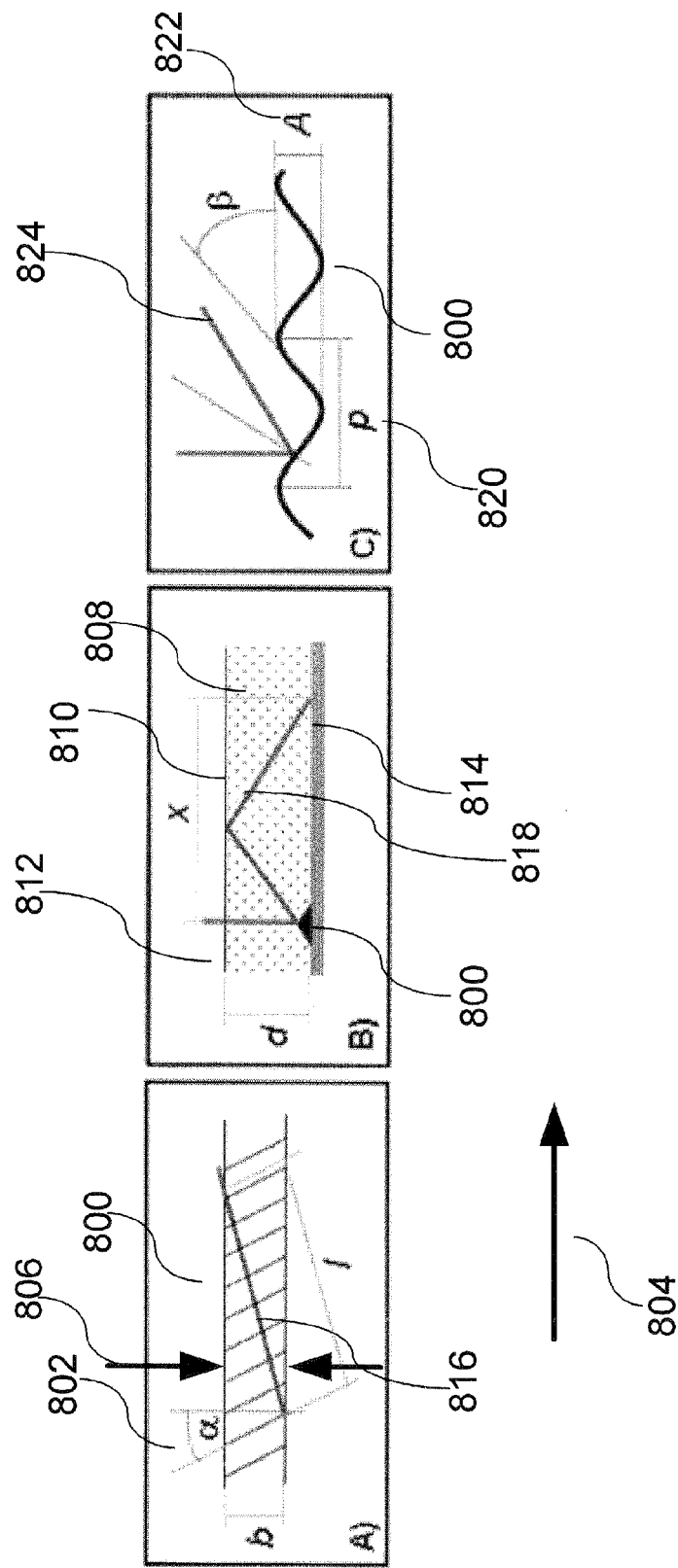

TABBING RIBBON AND PHOTOVOLTAIC SOLAR PANEL

CROSS-REFERENCE TO RELATED APPLICATION

This application claims priority to European Patent Application No. EP 10 195 378.4, which was filed Dec. 16, 2010, and is incorporated herein by reference in its entirety.

TECHNICAL FIELD

Various embodiments relate generally to a tabbing ribbon, a photovoltaic solar panel, a method for manufacturing a solar cell tabbing ribbon, and a machine for manufacturing a solar cell tabbing ribbon.

BACKGROUND

The electrical connection of one or more solar cells is conventionally provided by means of tabbing ribbons, which may be soldered onto so-called bus bars of the one or more solar cells. The entire electrical current generated by the solar cell is conducted through the tabbing ribbons.

U.S. Pat. No. 5,158,618 discloses bent contact wires for contacting a solar cell.

The cooling of tabbing ribbons after their soldering on a surface of a solar cell may result in substantial length differences and thus to substantial tensions within the system due to the substantial differences of the thermal expansion coefficients between the material of the tabbing ribbons and the material of the solar cell.

In order to address this issue, conventional tabbing ribbons may be made as particularly soft copper ribbons. However, soft copper ribbons are expensive and are only available from a small number of manufacturers in the desired quality. For light capturing tabbing ribbons can be very precisely patterned in their length direction. The light collection using these patterned tabbing ribbons requires specific bonding technologies, since the patterned tabbing ribbons cannot be soldered (the patterned trenches would be filled with the solder material) or the soldered areas have to be specifically adjusted to cell and module design. Furthermore, the patterned tabbing ribbons are also expensive due to its manufacturing technique and applied reflective layers made from expensive metals like silver.

SUMMARY

In various embodiments, a tabbing ribbon for connecting at least one solar cell is provided, wherein the tabbing ribbon at least partially extends in a non-planar manner and includes a non-planar section.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a force path diagram illustrating the characteristics of differently crimped or waved tabbing ribbons in accordance with various embodiments;

FIG. 4 shows a diagram illustrating the tensile forces at 0.25% extension of differently crimped or waved tabbing ribbons in accordance with various embodiments;

FIG. 5 shows the optical path of the light after the reflection at various steep regions of a crimped or waved tabbing ribbon;

FIGS. 6A to 6C show the optical path of a light reflected at an angle θ of about 45° (FIG. 6A), at an angle θ of exactly 45° (FIG. 6B), and at an angle θ of greater than 45° (FIG. 6C);

FIGS. 8A to 8C show the optical path of a light reflected at a tabbing ribbon in accordance with various embodiments;

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
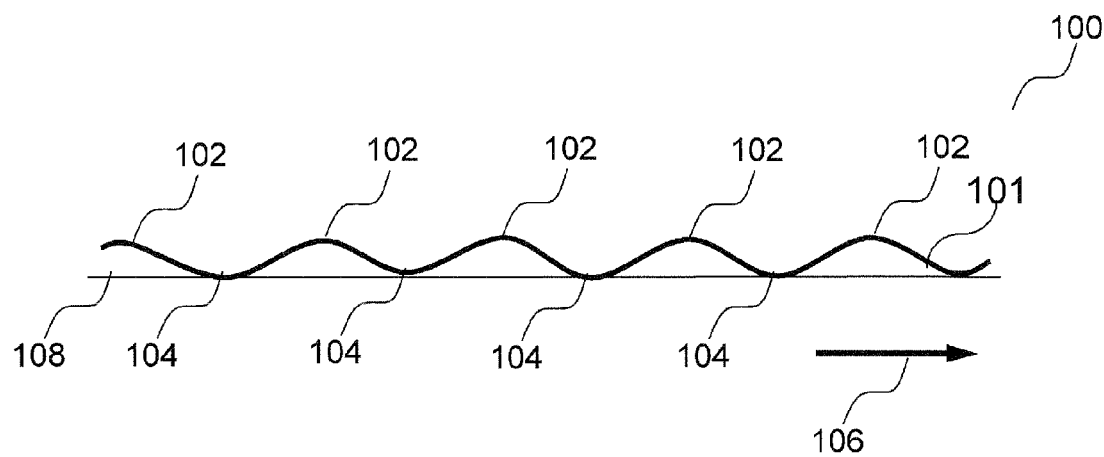
FIG. 1 shows a cross-sectional view of a tabbing ribbon soldered to a solar cell surface in accordance with various embodiments.

FIG. 1 shows a cross-sectional view 100 of a tabbing ribbon 101 along its main extension (symbolized in FIG. 1 by means of an arrow 106) together with a solar cell surface in accordance with various embodiments. As shown in FIG. 1, the tabbing ribbon 101 extends in a non-planar manner and may include a non-planar section. By way of example, the tabbing ribbon 101 extends in a meander-like shape. Furthermore, as also shown in FIG. 1, the non-planar section may include higher portions 102 and lower portions 104. In various embodiments, the non-planar section may include any arbitrary non-planar shape, e.g. regular and/or non-regular shapes. The lower portions 104 may be configured to (in other words provided for) (electrical and mechanical) contact with a surface of the solar cell to be connected. The cross section of the tabbing ribbon 101 perpendicular to its main extension is in general arbitrary. In various embodiments, the cross section of the tabbing ribbon 101 perpendicular to its main extension may e.g. be round (e.g. circular or elliptic, etc.) or polygonal (e.g. rectangular or quadratic or triangular, etc.). The tabbing ribbon 101 of FIG. 1 has a dimension in its cross section perpendicular to its main extension of e.g. about 1.5 mm*0.19 mm, although the dimensions may be selected differently depending on the requirements.

In various embodiments, the tabbing ribbon 101 illustratively may be crimped or waved. In various embodiments, the higher portions 104 may be configured to not to be contacted to the surface of the solar cell 108 to be connected. Thus, illustratively, portions (e.g. the higher portions 104) of the tabbing ribbon 101 on the side of the tabbing ribbon 101 directly physically contacting (e.g. bonded to, e.g. soldered, glued to) the surface of the solar cell 108 to be connected may not be in direct physical contact with the surface of the solar cell 108 to be connected. In various embodiments, the non-planar section may be formed in accordance with one of the following shapes: sinusoidal, half-circle, half-wave, trapeze, rectangular or triangular shape or any combination of previous mentioned shapes or between the previous mentioned shapes.

In various embodiments, the tabbing ribbon 101 may be made of a metal or may be covered with a metal. In various embodiments, the tabbing ribbon 101 may be made of a metal or may be covered with a metal such as e.g. copper; nickel; aluminum; tin; lead; zinc; bismuth; and/or silver; and/or any alloy of these metals.

Figure 2:
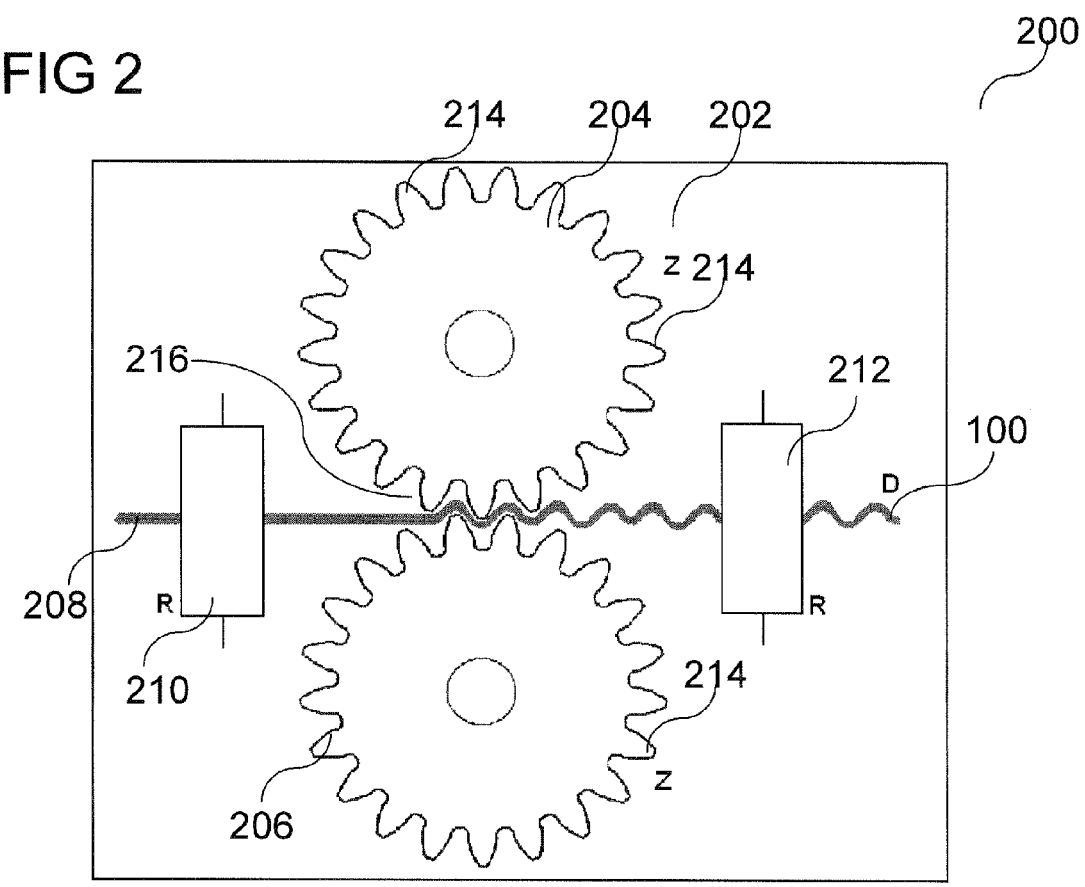
FIG. 2 shows a machine for manufacturing a solar cell tabbing ribbon in accordance with various embodiments.

FIG. 2 shows a machine 200 for manufacturing a solar cell tabbing ribbon in accordance with various embodiments. In various embodiments, the machine 200 may include a device 202 configured to form non-planar sections into the tabbing ribbon 101. In various embodiments, the device 202 may include a plurality of toothed wheels (e.g. a first toothed wheel 204 and a second toothed wheel 206) which are arranged relative to each other such that the solar cell tabbing ribbon 101 being moved between 216 the toothed wheels 204, 206 is shaped according to the tooth form of the toothed wheels 204, 206.

In various embodiments, a plurality or multiplicity of tabbing ribbons 101 may be structured, e.g. three tabbing ribbons 101 for a three busbar solar cell (in this implementation, six toothed wheels or one sufficiently broad roll may be provided).

In various embodiments, the tabbing ribbon 101 may be structured within, in other words during, the solar cell stringing and soldering process or before this process.

In alternative embodiments, not shown in FIG. 2, the device 202 may include a plurality of press molds which are arranged relative to each other such that the solar cell tabbing ribbon 101 being arranged between the press molds is shaped according to the mold form.

In various embodiments, for every tabbing ribbon 101 e.g. for three tabbing ribbons 101 for a three busbar solar cell, one press mold or a large press mold for every tabbing ribbon may be provided.

Figure 11:
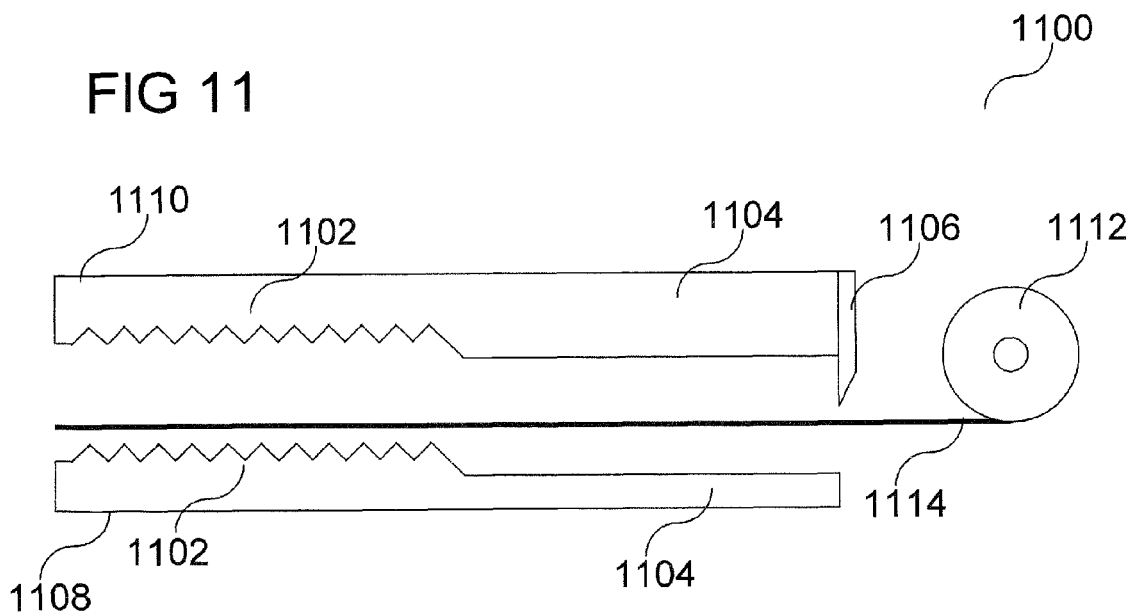
FIG. 11 shows a press mold device in accordance with various embodiments.
Figure 12:
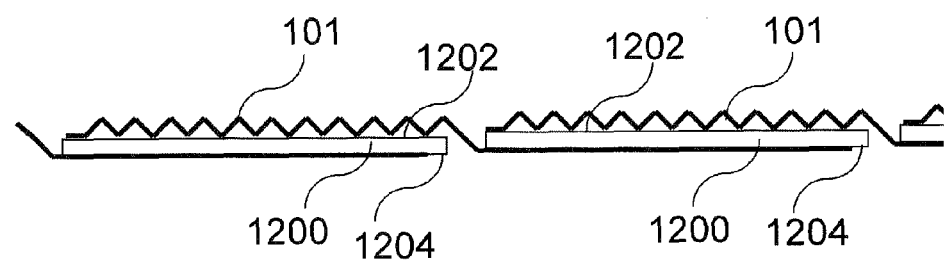
FIG. 12 shows solar cells with tabbing ribbons arranged thereon, wherein the tabbing ribbons are structured using the press mold device of FIG. 11 in accordance with various embodiments.

FIG. 11 shows a press mold device 1100 in accordance with various embodiments. As shown in FIG. 11, the press mold device 1100 may have a plurality of portions, e.g. three portions, e.g. a first press mold portion 1102, a second press mold portion 1104 and a cutting knife 1106 (which may also be referred to as cutting blade 1106), wherein the cutting knife 1106 is provided to cut portions of an unstructured tabbing ribbon 1114 out of the continuous "endless" tabbing ribbon 1114 provided from a tabbing ribbon roll 1112. As shown in FIG. 11, the press mold device 1100 has a lower part 1108 and an upper part 1110. Both, the lower part 1108 and the upper part 1110 are structured in their respective first press mold portion 1102, e.g. toothed, such that when the lower part 1108 and the upper part 1110 are pressed together and the unstructured tabbing ribbon 1114 is arranged between the lower part 1108 and the upper part 1110, the portion of the unstructured tabbing ribbon 1114 lying in the first press mold portion 1102 will be structured in accordance with the structure of the lower part 1108 and the upper part 1110 in the first press mold portions 1102. Furthermore, in various embodiments, the respective second press mold portion 1104 in the lower part 1108 and the upper part 1110 may be unstructured, in other words, may have plane opposing surfaces such that the portion of the unstructured tabbing ribbon 1114 lying in the second press mold portion 1104 will remain unstructured. It should be mentioned that in various alternative embodiments, the respective second press mold portion 1104 in the lower part 1108 and the upper part 1110 may also be (fully or partially) structured, similar or different as compared with the structure of the respective first press mold portion 1102 in the lower part 1108 and the upper part 1110. In various embodiments, the structured portion of the tabbing ribbon 101 may be provided for the front surface 1202 of a solar cell 1200, as shown in FIG. 12, and the unstructured portion of the tabbing ribbon 101 may be provided for the rear surface 1204 of a solar cell 1200. FIG. 11 furthermore shows the tabbing ribbon roll 1112 onto which the unprocessed (i.e. still completely unstructured) tabbing ribbon 101 is rolled.

Referring back to FIG. 2, it is shown that an initially planar solar cell tabbing ribbon 208 is actively supplied to and through the device 202 so that a part of the planar solar cell tabbing ribbon 208 or the entire planar solar cell tabbing ribbon 208 is crimped or waved by means of the device 202, e.g. by means of the toothed wheels 204, 206. In various embodiments, the toothed wheels 204, 206 are actively driven, e.g. by means of a motor (not shown) or the like. The active driving of the toothed wheels 204, 206 may avoid a straining or forging of the solar cell tabbing ribbon which might result in an undesired stiffening of the solar cell tabbing ribbon. In various alternative embodiments, it may also be provided to pull the tabbing ribbon 101 only without driving the wheels actively.

FIG. 2 also shows a feeding device 210 configured to securely and smoothly feeding the planar solar cell tabbing ribbon 208 into the device 202, e.g. the arrangement of the toothed wheels 204, 206. An output device 212 is also provided, which may be configured to securely and smoothly outputting the crimped or waved solar cell tabbing ribbon 101.

In various embodiments, the main axis of the toothed wheels 204, 206 may be aligned in parallel to each other to form a linear ribbon. A V-shaped arrangement of the toothed wheels 204, 206 may result in a bow of the crimped or waved solar cell tabbing ribbon 101. As shown as an example in FIG. 2, the solar cell tabbing ribbon 101 may have a sinusoidal extension as a result of the forming of the solar cell tabbing ribbon by means of the toothed wheels 204, 206.

In various embodiments, the shape of the tooths of the toothed wheels 204, 206 or rolls as well as the distance of the tooths that are together pressed onto the tabbing ribbon 101 has an immediate impact on the degree of waviness of the tabbing ribbon 101. By way of example, the smaller the distance between the toothed tooths and the steeper and longer the tooths in the overlapping region of the tooths effecting on the tabbing ribbon 101, the higher the degree of waviness of the tabbing ribbon 101.

Figure 13:
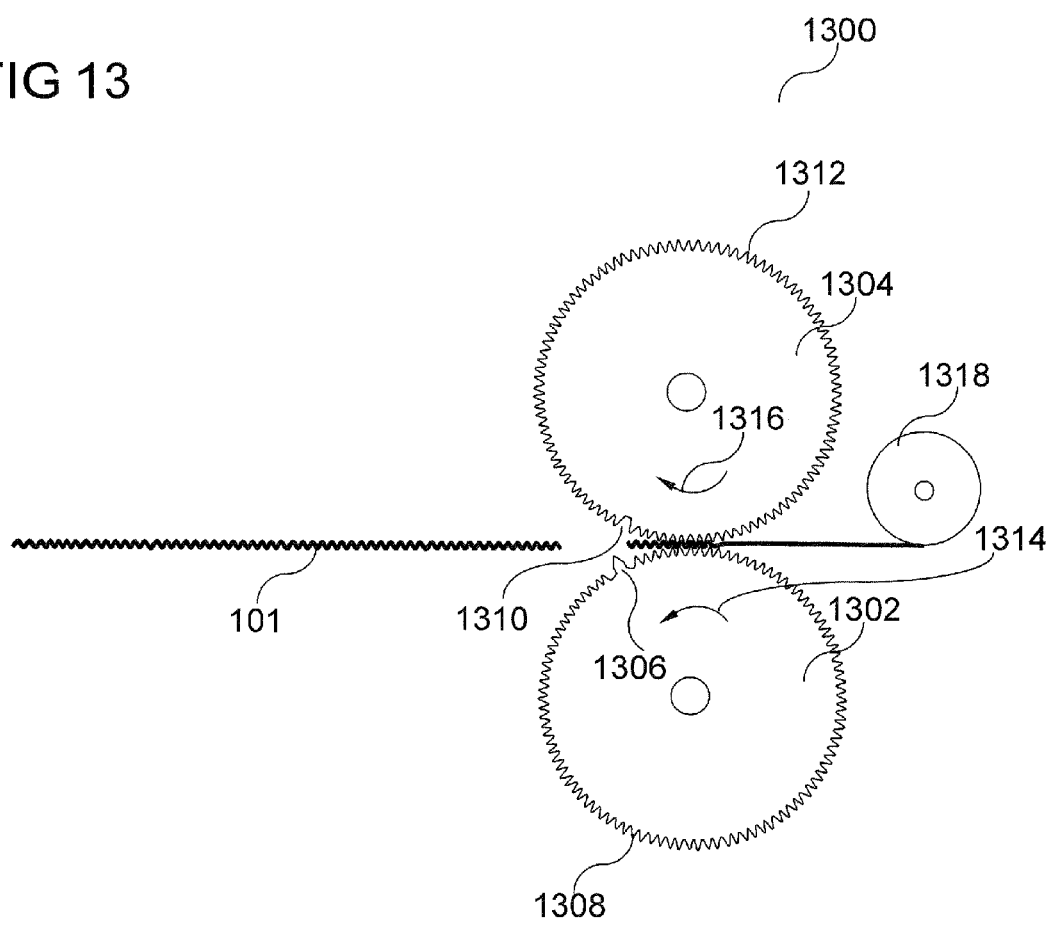
FIG. 13 shows an arrangement including toothed wheels in accordance with various embodiments.

FIG. 13 shows an arrangement 1300 including toothed wheels 1302, 1304 in accordance with various embodiments (in alternative embodiments, the toothed wheels 1302, 1304 may be replaced by toothed rolls). In these embodiments, the toothed wheels 1302, 1304 may include an integrated cutting device, wherein e.g. a first toothed wheel 1302 may include a cutting blade 1306 (which may be provided on the periphery of the first toothed wheel 1302 between the teeth 1308 on the first toothed wheel 1302) and a second toothed wheel 1304 may include a corresponding cavity 1310 (which may be provided on the periphery of the second toothed wheel 1304 between the teeth 1312 on the second toothed wheel 1304) such that the cutting blade 1306 will engage with the cavity 1310 to thereby cut the structured tabbing ribbon 101 as shown in FIG. 13. Furthermore, arrows 1314, 1316 symbolize the direction of rotation of the first toothed wheel 1302 and the second toothed wheel 1304, respectively. Furthermore, FIG. 13 shows a tabbing ribbon roll 1318 onto which the unprocessed (i.e. still completely unstructured) tabbing ribbon is rolled and provided to the toothed wheels 1302, 1304.

The machine 200 may include a second toothed wheel 206, which may be fixed by means of respective screws and screw nuts. With this implementation, it is e.g. possible to set different distances between the first toothed wheel 204 and the second toothed wheel 206, between which the solar cell tabbing ribbon 101 is driven through. In various embodiments, the distance between the first toothed wheel 204 and the second toothed wheel 206 may determine the height of the crimped or waved structure, e.g. of the crimped or waved solar cell tabbing ribbon 101.

Thus, illustratively, in various embodiments, the device 202 to shape the solar cell tabbing ribbon 101 may be configured such that the non-planar sections are formed with a shape axis different from 90° angle to the main extension of the solar cell tabbing ribbon 101. In various embodiments, the shape axis of the non-planar section may be about 90° angle to the main extension of the solar cell tabbing ribbon 101. Furthermore, in various embodiments, the shape axis of the non planar section may be different from 90° angle to the main extension of the solar cell tabbing ribbon 101 for reflecting light from the solar cell tabbing ribbon 101 via total internal reflection at the cover plane of a solar panel including the solar cell, to the solar cell. In various embodiments, the shape axis is at angle α to the main extension direction of the solar cell tabbing ribbon 101 may be determined in accordance with $$\alpha > \arcsin\left(\frac{b}{2d}\right),$$

wherein b denotes the width of the solar cell tabbing ribbon 101, and wherein d denotes the distance between the surface of a solar cell connected to the solar cell tabbing ribbon 101 and the cover plane of the solar panel including the solar cell with the solar cell tabbing ribbon 101.

As outlined above, different thermal expansion coefficients of e.g. a solder-covered copper tabbing ribbon and the material of the solar cell, e.g. silicon, may result in substantial length differences of about 0.3 mm to about 0.4 mm between the tabbing ribbon and the solar cell after the cooling of the solidified solder down to room temperature.

Illustratively, in an implementation, a length difference of 0.4 mm to e.g. 156 mm corresponds to an extension of 0.25%.

The following equation shows an example of an estimation of the extension, wherein $\alpha_{Cu}$ designates the thermal expansion coefficient of copper, $\alpha_{Si}$ designates the thermal expansion coefficient of silicon, L designates the length of the tabbing ribbon and ΔL designates the resulting change in length due to the differences of the thermal expansion coefficients depending on the change of temperature ΔT:

$$\Delta L = L \times (\alpha_{Cu} - \alpha_{Si}) \times \Delta T = 0.3 - 0.4 \text{ mm};$$

$$L \approx 156 \text{ mm } \Delta T \approx 155 - 195 \text{K } \alpha_{Si} = 3 \text{ ppmK}^{-1} \alpha_{Cu} = 17 \text{ ppmK}^{-1}.$$

In various embodiments, the reduction of the tensile strength of the tabbing ribbon due to the crimping or waving, in general the patterning, may reduce the built up compression stress in the soldered solar cell e.g. to a minimum, since those portions of the tabbing ribbon which are not soldered to the surface of the solar cell may easily be extended during the cooling of the solder. Those portions of the tabbing ribbon which are soldered to the surface of the solar cell remain soldered and thus fixed to the surface of the solar cell even after the soldering of the tabbing ribbon. This may allow the use of the following: thinner solar cells, thicker tabbing ribbons having lower power losses, harder and thus cheaper material, e.g. metal, e.g. copper, for the tabbing ribbon and/or solder pads having a smaller surface area.

Referring again back to FIG. 1, as described above, FIG. 1 shows a solar cell 108 with a tabbing ribbon 101 being soldered to the solar cell, in more detail to a (front) surface of the solar cell 108 in accordance with various embodiments. The solar cell 108 may include metallization conductors, e.g. in the form of contact fingers, which may be burnt into an anti-reflection layer provided on the top of the front side (light receiving side) of the solar cell 108. The metallization conductors thus provides an electrical contact to the solar cell emitter region (not shown) and thus conducts electrical charge carriers from the solar cell emitter region to the tabbing ribbon 101 being soldered to the (front) surface of the solar cell 108 by means of a solder layer being provided (e.g. printed) on the (front) surface of the solar cell 108. As shown in FIG. 1, the higher portions 102 of the tabbing ribbon 101 are not in direct physical contact (in other words, not bonded, e.g. not soldered) to the surface of the solar cell 108, whereas the lower portions 104 are in direct physical contact (in other words, bonded, e.g. soldered) to the surface of the solar cell 108 (e.g. by means of the solder layer).

FIG. 3 shows a example of an force path diagram 300 illustrating the characteristics of differently crimped or waved tabbing ribbons in accordance with various embodiments compared with an unstructured, in other words uncrimped or non-waved tabbing ribbon of the same thickness. The force path diagram 300 illustrates a force in Newton [N] over an extension in millimeters [mm]. FIG. 3 shows a first characteristic 302 illustrating the occurring force for a given extension of a respective tabbing ribbon, wherein the crimped or waved tabbing ribbons have a sinusoidal shape having a respectively given height from the lowest point of the respective structure to the highest point of the respective structure. The first characteristic 302 shows a rather large occurring force with increasing extension of the tabbing ribbon. As is shown in FIG. 2, all crimped or waved tabbing ribbons show a lower occurring force with increasing extension of the respective tabbing ribbon compared with the first characteristic 302. In more detail, as is also shown in FIG. 2, the greater the height of the crimping or waving of the tabbing ribbon, the less force is generated with increasing extension. By way of example, the second characteristic 304 shows the force occurring for an extension for a tabbing ribbon having a sinusoidal height of the crimping or waving of 0.05 mm. The force is lower than the force occurring in an uncrimped or non-waved tabbing ribbon as represented by the first characteristic 302. Furthermore, a third characteristic 306 shows the force occurring for an extension for a tabbing ribbon having a sinusoidal height of the crimping or waving of 0.15 mm. The force is lower than the force occurring for the tabbing ribbon as represented by the second characteristic 304. Moreover a fourth characteristic 308 shows the force occurring for an extension for a tabbing ribbon having a sinusoidal height of the crimping or waving of 0.42 mm. The force is even lower than the force occurring for the tabbing ribbon as represented by the third characteristic 306.

FIG. 4 shows a diagram 400 illustrating the tensile forces at 0.25% extension of differently crimped or waved tabbing ribbons in accordance with various embodiments. By way of example, as shown in the force path diagram 300 of FIG. 3, at an extension of 0.25%, which may occur after the cooling process of the soldering of a solar cell such as the solar cell 108, a tensile force of only 0.38 N has been found for the strongly crimped or waved tabbing ribbon having a copper ribbon thickness of 150 µm. As a comparison, the force determined for the uncrimped or non-waved tabbing ribbon having a copper ribbon thickness of 150 µm at an extension of 0.25% may be 21.3 N. It is to be noted that the specific values shown in the diagram 400 are dependent on the concretely used tabbing ribbon (e.g. of the hardness of e.g. the copper core) and the used geometry of the ondulation. Thus, the diagram 400 is to be understood to illustrate the results rather in principle. FIG. 5 shows the optical paths of the light after the reflection at various steep regions of a crimped or waved tabbing ribbon.

FIG. 5 shows a cross sectional view 500 of an upper portion of a solar module illustrating a tabbing ribbon portion 502 and a glass cover 504 (providing an glass-air interface for the light rays) being arranged above the tabbing ribbon portion 502. Light rays are symbolized in FIG. 5 by means of arrows 506.

As shown in FIG. 5, for a given example of a Solar module with a frontside of refraction index at 1.5, the geometry of the crimped or waved tabbing ribbon determines the portion of the light being reflected under the total internal reflection angle of the glass-air interface, wherein only regions of the tabbing ribbon structure having a steepness, in other words an angle θ, of greater than 21° effectuate a light collection effect with a light incident being normal to the plane defined by the glass-air interface formed by the glass cover 704. For too steep structures or steeper parts of the structure with an reflection angle θ, of about 45° the light cannot be trapped because of double reflection at the structure (see FIGS. 6A to 6C).

FIGS. 6A to 6C show the optical path 602, 604, 606 of light reflected at the tabbing ribbon 600 at an angle θ of about 45° (FIG. 6A), at an angle θ of exactly 45° (FIG. 6B), and at an angle θ of greater than 45° (FIG. 6C)

Figure 7A:
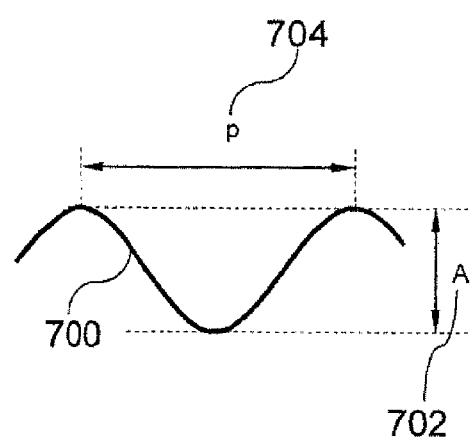
FIGS. 7A and 7B show an illustration of an aspect ratio of a tabbing ribbon in accordance with various embodiments (FIG. 7A) and a diagram illustrating the portion of light capturing in a tabbing ribbon dependent on the aspect ratio of the tabbing ribbon in accordance with various embodiments (FIG. 7B)

At an increased angle θ of the tabbing ribbon structure of close to 45° the light ray being reflected at the tabbing ribbon 600 under a very flat angle touches the top region of adjacent mountains (e.g. higher portions of the tabbing ribbon 600) and will be reflected there again under a still very low angle by the tabbing ribbon structure 600 and may still be recaptured (see e.g. FIG. 6A). At an angle θ of the tabbing ribbon structure 600 of equal or very close to 45°, however, the case shown in FIGS. 6B and 6C will occur, and the light will leave the solar module and cannot be captured. This means too flat structures but also too steep structures may not be suitable for light capturing. Best light capturing results will be obtained with a mainly triangular shaped structure with an angle between 21° and less than 45° for an embedding with refraction index of about 1.5. In order to estimate the portion of captured light, an EVA-glass (ethylene vinyl acetate) embedding solar cell is assumed having a refraction index in the range from 1.48 to 1.50. Furthermore, an incident light being perpendicular to the solar cell main surface and a sinusoidal structure of the tabbing ribbon is assumed. In this case, the ratio between the height A 702 of the structure of the tabbing ribbon 700 and the wavelength p 704 (aspect ratio) of the structure of the tabbing ribbon 700 (see FIG. 7A) determine the light capturing, as shown in a diagram 710 in FIG. 7B.

Figure 7B:
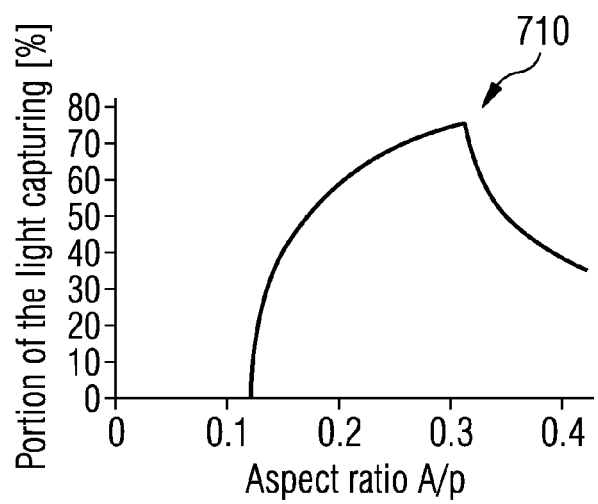

As shown in FIG. 7B, only starting with a certain ratio of height to width of the tabbing ribbon structure, light perpendicularly impinging on a solar module may be captured (the surfaces start to exceed a steepness of 21°). Starting with an aspect ratio in the range from about 0.6 to about 0.7 regions of the tabbing ribbon structure reach 45°-now, due to the effect outlined above, light will be reflected at the tabbing ribbon structure a plurality of times and can no longer be captured. The portion of the light capturing may additionally be increased by impressing structures having a more acute angle—this may be particularly interesting in order to keep the absolute height of the crimped or waved tabbing ribbon small to e.g. avoid an adjustment of the EVA-layer thickness in the solar module.

Figure 14:
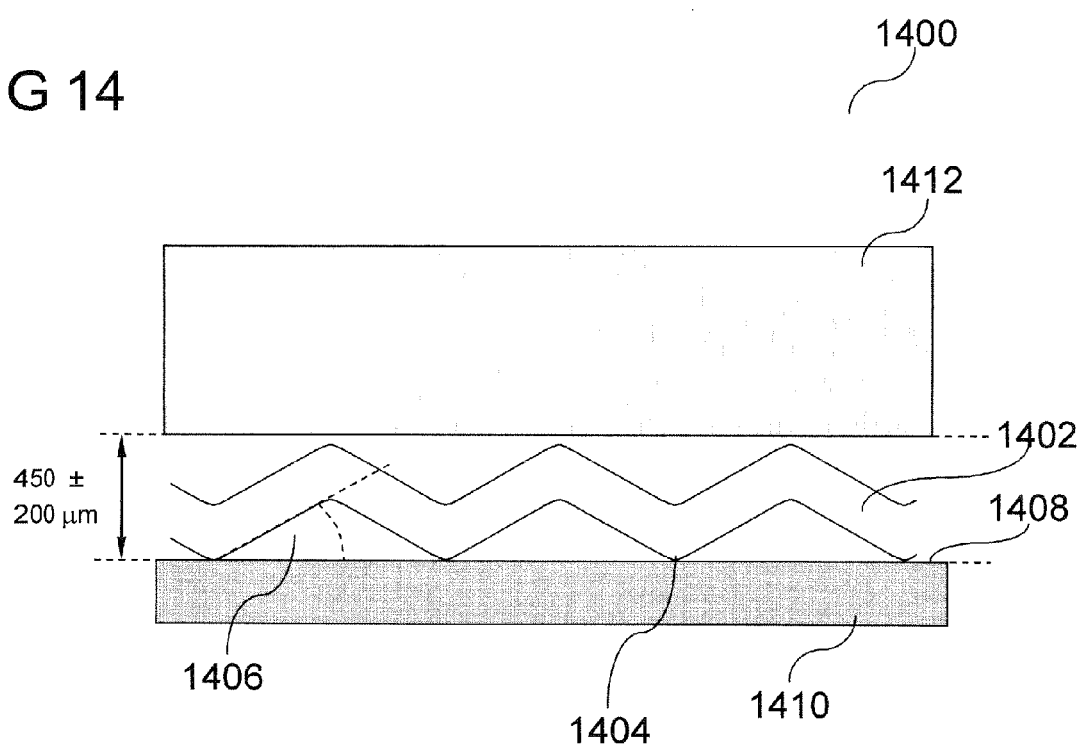
FIG. 14 shows an arrangement in accordance with various embodiments.

Furthermore, as shown in an arrangement 1400 in FIG. 14, in various embodiments, the tabbing ribbon 1402 may include a structure having triangularly shaped teeth 1404, wherein an angle α 1406 between an upper surface 1408 of a solar cell 1410 and the lower surface of the tabbing ribbon opposing the upper surface 1408 of the solar cell 1410 may be greater than 21°, e.g. about 25°. As shown in FIG. 14, the tabbing ribbon 1402 may be arranged on the upper surface 1408 of the solar cell 1410 below a frontside cover 1412 (e.g. frontside glass 1412) and may be embedded within embedding material such as e.g. EVA. The frontside cover 1412 may be arranged above the upper surface 1408 of the solar cell 1410 e.g. at a distance of about 450 µm±200 µm, e.g. at a distance of about 400 µm±200 µm.

FIG. 8A shows a tabbing ribbon 800 in accordance with various embodiments.

In various embodiments, the tabbing ribbon 800 may have a tilted or slanted structure providing a light conducting to the active solar cell surface (i.e. the emitter side surface of the solar cell). In various embodiments, the tabbing ribbon 800 may have a slanted meander-like shape such that the shape axis is at a tilt angle α 802 to the main extension direction (symbolized in FIG. 8A by means of an arrow 804) of the tabbing ribbon 800 is determined in accordance with $$\alpha > \arcsin\left(\frac{b}{2d}\right),$$

wherein b denotes the width 806 of the tabbing ribbon 800, and wherein d denotes the distance between the surface of a solar cell connected to the tabbing ribbon and the cover plane of the solar panel including the solar cell with the tabbing ribbon 800 as illustrated in FIG. 8B.

Due to the slanted shape of the non-planar section of the tabbing ribbon 800, in various embodiments, captured light is conducted next to the tabbing ribbon 800 to the active solar cell surface and it will usually not impinge again on the tabbing ribbon 800 itself, as it would be the case with a non-planar section being perpendicular to the tabbing ribbon main extension direction. Thus, as described above, in various embodiments, the tabbing ribbon 800 may have a non-planar section, the inclination of which may be non-zero with respect to the tabbing ribbon main extension direction.

Such an inclined meander-like shape structure in the tabbing ribbon may be manufactured using e.g. the toothed wheels or rolls 204, 206, wherein the tooths may be tilted in the later tilt angle α of the structure.

In various embodiments, the angle α 802 to the main extension direction of the tabbing ribbon 800 should be large enough so that the path of the light taken under the critical angle of the total internal reflection within the solar module impinges to the surface of the solar cell next to the tabbing ribbon 800.

In various embodiments, the angle α 802 to the main extension direction of the tabbing ribbon 800 may depend on the thickness d of the entirety of the embedding 808 plus the glass cover 810 of a solar module 812 including one or more solar cells 814 and the tabbing ribbon 800 (see e.g. FIG. 8B), as well as on the width b of the tabbing ribbon 800 (see e.g. FIG. 8A).

FIG. 8A shows a top view of a tabbing ribbon 800 in accordance with various embodiments, wherein the angle α 802 as well as the direction of the light conduction (symbolized in FIG. 8A by means of a line 816).

FIG. 8B shows a cross sectional view through a solar module 812 having the thickness d of the entirety of the embedding 808 plus the glass cover 810 over the solar cell 814. A light path is symbolized in FIG. 8B by means of another line 818.

FIG. 8C shows structure parameters of a crimped or waved tabbing ribbon 800 in accordance with various embodiments, e.g. a wavelength p 820 and a height A 822. A light path is symbolized in FIG. 8C by means of yet another line 824.

Referring again to FIG. 8B, the required angle α 802 of the tabbing ribbon structure for the conduction of the light to the active solar cell surface may be determined under the assumptions: x>1 with x≈2d; l=b/sin α in accordance with the following formula:

$$\alpha > \arcsin\left(\frac{b}{2d}\right).$$

In various embodiments, in which a slanted crimping or waving of the tabbing ribbon is provided, which will be described in more detail below, however, at least from the edge region of the tabbing ribbon no light impinges on the opposing mountain edge of the tabbing ribbon and will be guided laterally outside the tabbing ribbon structure onto the active solar cell surface.

Figure 9:
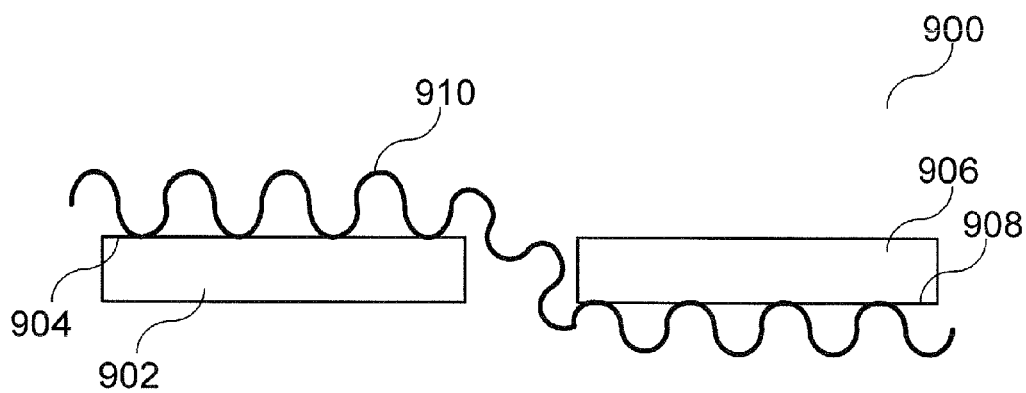
FIG. 9 shows a plurality of solar cells with a tabbing ribbon connecting the solar cells in accordance with various embodiments.

FIG. 9 shows a solar cell arrangement 900 including a plurality of solar cells, e.g. a first solar cell 902 and a second solar cell 906. The solar cell arrangement 900 may further include a tabbing ribbon 910, which may be bonded (e.g. soldered or by means of a conductive adhesive) to an upper surface 904 (e.g. the light receiving surface) of the first solar cell 902 and which may be bonded (e.g. soldered or by means of a conductive adhesive) to the backside 908 of the second solar cell 906, thereby connecting the solar cells 902, 906.

Figure 10:
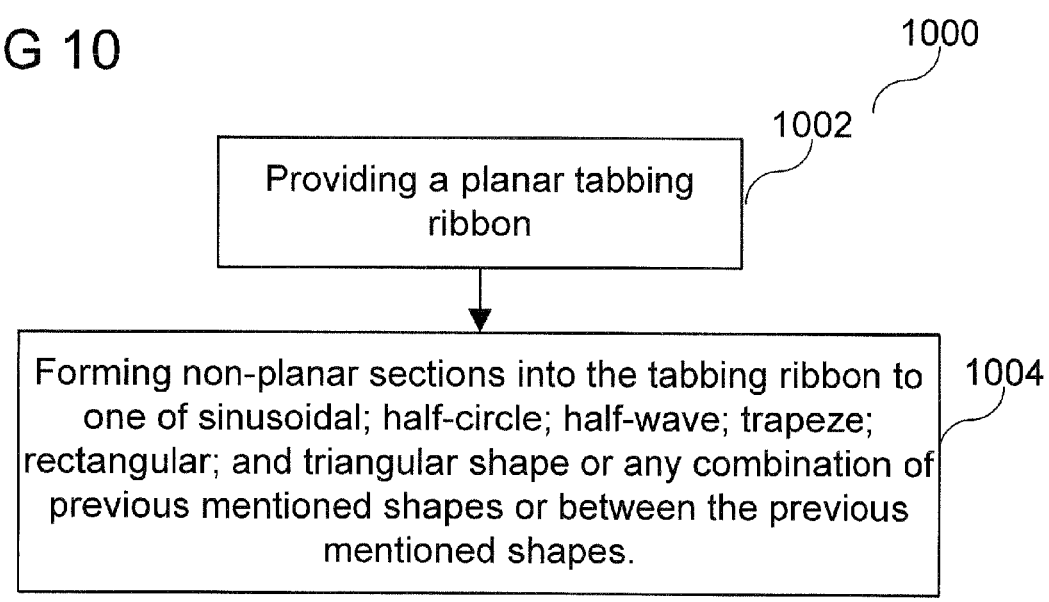
FIG. 10 shows a flow diagram illustrating a method for manufacturing a solar cell tabbing ribbon in accordance with various embodiments.

FIG. 10 shows a flow diagram illustrating a method 1000 for manufacturing a solar cell tabbing ribbon in accordance with various embodiments. In various embodiments, the method may include, in 1002, providing a planar tabbing ribbon; and, in 1004, forming non-planar sections into the tabbing ribbon to one of sinusoidal; half-circle; half-wave; trapeze; rectangular; and triangular shape or any combination of previous mentioned shapes or between the previous mentioned shapes. The shape axis of the non-planar sections may be about 90° angle to the main extension of the tabbing ribbon. The shape axis of the non-planar sections may be different from 90° angle to the main extension of the tabbing ribbon for reflecting light from the tabbing ribbon via total reflection beside the tabbing ribbon to the solar cell. Furthermore, the shape axis may be at an angle α to the main extension direction of the tabbing ribbon is determined in accordance with $$\alpha > \arcsin\left(\frac{b}{2d}\right),$$

wherein b denotes the width of the tabbing ribbon, and wherein d denotes the distance between the surface of a solar cell connected to the tabbing ribbon and the cover plane of the solar panel comprising the solar cell with the tabbing ribbon. In various embodiments, the non-planar sections may be formed by means of rotating toothed wheels. In various embodiments, the non-planar sections may be formed by means of a molding press.

In various embodiments, a device for patterning or crimping tabbing ribbons is provided, which is easy to be upgraded at the stringers in the solar module production line.

In various embodiments, the hardness of the tabbing ribbon may be reduced by means of the crimping, which makes it possible

- to use thinner solar cells;
- to use thicker tabbing ribbons having a lower electrical resistance;
- to use harder and thus less expensive metal (e.g. copper) for the tabbing ribbon;
- to use solder pads having smaller surface areas.

In various embodiments, although the crimped tabbing ribbon may have a greater actual length and thus an increased electrical resistance, the possible substantially reduced hardness of the crimped or waved tabbing ribbon in accordance with various embodiments enables the use of a thicker tabbing ribbon, which may overcompensate the increase of the electrical resistance due to the increased length.

In various embodiments, the toothed wheels may include a triangular shape of at least some of their teeth in order to further increase the light collecting effect. In various embodiments, to the wheels or rolls a cutting device (blade) may be implemented or this device may be implemented later in the stringing process.

Various embodiments provide a tabbing ribbon for connecting at least one solar cell, wherein the tabbing ribbon at least partially extends in a non-planar manner and includes a non-planar section.

In various embodiments, a tabbing ribbon may be understood, in contrast to a contact wire, as a conductive ribbon, wherein the width b thereof is substantially larger than its thickness d. By way of example, in various embodiments, a tabbing ribbon may be understood as a conductive ribbon, wherein the width b thereof is larger than its thickness d by a factor 5(b>d*5), e.g. by a factor 6(b>d*6), e.g. by a factor 7(b>d*7), e.g. by a factor 8(b>d*8), e.g. by a factor 9(b>d*9), e.g. by a factor 10(b>d*10), e.g. by a factor 15(b>d*15), e.g. by a factor 20(b>d*20), or even more.

In various embodiments, a solar cell may be understood as being a device which directly converts light energy (e.g. at least a portion of the light in the visible wave length region in the range from about 300 nm to about 1150 nm, e.g. sunlight) into electrical energy by means of the so called photovoltaic effect.

Various embodiments may reduce the tensions within the system including at least one solar cell and one or more tabbing ribbons.

In various embodiments, solar cells, which may be formed in or on a wafer, e.g. a semiconductor wafer, may be electrically connected to each other to e.g. be encapsulated as a solar module. A solar module may include a glass, ETFE or other layer on its front side (i.e. the sunny side, also referred to as the emitter side), which allows light impinging onto the solar module to pass the glass layer (which may also be referred to as frontside or front layer), while at the same time it protects the wafer or the solar cells from being damaged, e.g. due to rain, hail, snow, and the like.

In various embodiments, the solar cell may have the following dimensions: a width in the range from about 2 cm to about 50 cm, a length in the range from about 2 cm to about 50 cm, and a thickness in the range from about 100 μm to about 300 μm.

In various embodiments, the solar cell may include at least one photovoltaic layer (e.g. as a part of a layer structure having one or more layers). The at least one photovoltaic layer may include or consist of a semiconductor material (such as e.g. silicon), a compound semiconductor material (such as e.g. a III-V-semiconductor material (such as e.g. GaAs), a II-VI-semiconductor material (such as e.g. CdTe), or a I-III-VI-semiconductor material (such as e.g. CuInS$_2$). In various embodiments, the at least one photovoltaic layer may include or consist of an organic material. In various embodiments, the silicon may include or consist of single-crystalline silicon, poly-crystalline silicon, amorphous silicon, and/or micro-crystalline silicon. The at least one photovoltaic layer may include or consist of a junction such as e.g. a pn-junction, a pin-junction, a Schottky-type junction, and the like, as will be described in more detail below.

In various embodiments, the rear side of the solar cell may include a rear side electrode. The rear side electrode may include or consist of electrically conductive material, e.g. one or more metals. In various embodiments, the rear side electrode may be reflective. Furthermore, in various embodiments, the rear side electrode may be patterned. In various embodiments, the rear side may be made as a grid to reduce electrical losses for instance by recombination.

As will also be described in the following, in various embodiments, an electric contacting structure, e.g. implemented in the form of a plurality of metallization lines, in other words, metallization conductors (e.g. in the form of contact fingers), may be provided on or above the front surface of the at least one photovoltaic layer. The metallization lines may run substantially parallel to one another and/or at a distance from each other. However, it is to be noted that the metallization lines may alternatively run at an angle to each other, with or without crossing each other. In various embodiments, the metallization lines may be provided in a comb structure having a plurality of metal fingers, which run substantially parallel to each other. In various embodiments, the metallization lines may be provided in a strip shape electrically conductive surface region. In various embodiments, the electric contacting structure may e.g. be implemented in the form of a plurality of electrically conductive point contacts.

In various embodiments, the layer structure including the at least one photovoltaic layer which may be p-doped (e.g. using boron as doping species).

In various embodiments, the tabbing ribbon(s) may be (partially) mechanically and electrically connected to the electric contacting structure.

In various embodiments, the tabbing ribbon may at least partially, e.g. completely, extend in a meander-like shape. When bonded, e.g. glued, e.g. soldered, to the surface of a solar cell, in various embodiments, it may be provided that not the entire contacting surface of the tabbing ribbon is in direct physical contact with the surface of the solar cell, but some portions are free so that during the cooling phase, the non-contacting portions may illustratively provide for a compensation of the length differences and thus of the tensions within the system due to the substantial differences of the thermal expansion between the tabbing ribbons and the solar cell.

In various embodiments, the non planar section may include lower portions and higher portions; and the lower portions may be configured to contact with in other word to be in physical contact with, a surface of the solar cell to be connected.

Furthermore, in various embodiments, the higher portions may be configured to not to be contacted to the surface of the solar cell to be connected.

Moreover, in various embodiments, the non-planar section may be formed in accordance with one of the following shapes: sinusoidal, half-circle, half-wave, trapeze, rectangular or triangular shape or any combination of previous mentioned shapes or between the previous mentioned shapes.

In various embodiments, the shape axis of the non planar section is about 90° angle to the main extension of the tabbing ribbon.

In various embodiments, the shape axis of the non planar section is different from 90° angle to the main extension of the tabbing ribbon for reflecting light from the tabbing ribbon via total reflection at the cover plane of a solar panel comprising the solar cell, to the solar cell.

In various embodiments, the shape axis is at angle α to the main extension direction of the tabbing ribbon is determined in accordance with $$\alpha > \arcsin\left(\frac{b}{2d}\right),$$

wherein b denotes the width of the tabbing ribbon, and wherein d denotes the distance between the surface of a solar cell connected to the tabbing ribbon and the cover plane of the solar panel comprising the solar cell with the tabbing ribbon.

In various embodiments, the tabbing ribbon may be made of a metal or may be covered with a metal.

In various embodiments, the tabbing ribbon may be made of a metal or is covered with a metal selected from a group of metals consisting of: copper; nickel; aluminum; tin; lead; zinc; bismuth; and silver; and any alloy of these metals.

In various embodiments, tabbing ribbons may be made of a cheaper and, if desired, harder material, e.g. made of harder copper. Furthermore, in various embodiments, the tabbing ribbon may be made thicker so that the electrical losses within the tabbing ribbon may be reduced. As a result, in various embodiments, the solar cells may be made thinner. Moreover, in various embodiments, it is made possible to bond, e.g. glue, e.g. solder these above mentioned tabbing ribbons to filigree structures on solar cells (e.g. solder pads). Moreover, in various embodiments, additional module power may be generated due to additional light collection, depending on the shape of the tabbing ribbons in accordance with various embodiments.

In various embodiments, a photovoltaic solar panel may be provided. The photovoltaic solar panel may include at least one solar cell; and a tabbing ribbon in accordance with various embodiments as described above or as will be described in more detail below. The tabbing ribbon may electrically connect the at least one solar cell.

In various embodiments, the non-planar section of the tabbing ribbon may be electrically connected to the light receiving surface of the at least one solar cell and the backside of another solar cell.

In various embodiments, the tabbing ribbon may be connected to the at least one solar cell by means of solder or by means of conductive adhesive.

In various embodiments, a method for manufacturing a solar cell tabbing ribbon is provided. The method may include providing a planar tabbing ribbon; and forming non-planar sections into the tabbing ribbon to one of sinusoidal; half-circle; half-wave; trapeze; rectangular; and triangular shape or any combination of previous mentioned shapes or between the previous mentioned shapes.

In various embodiments, the shape axis of the non-planar sections is about 90° angle to the main extension of the tabbing ribbon.

In various embodiments, the shape axis of the non-planar sections is different from 90° angle to the main extension of the tabbing ribbon for reflecting light from the tabbing ribbon via total reflection to the solar cell.

In various embodiments, the shape axis is at angle α to the main extension direction of the tabbing ribbon is determined in accordance with $$\alpha > \arcsin\left(\frac{b}{2d}\right),$$

wherein b denotes the width of the tabbing ribbon, and wherein d denotes the distance between the surface of a solar cell connected to the tabbing ribbon and the cover plane of the solar panel including the solar cell with the tabbing ribbon.

In various embodiments, the non-planar sections are formed by means of rotating toothed wheels or rollers.

In various embodiments, the toothed wheels or rollers may be constructed as cutting wheels or cutting rollers e.g. by an included blade to cut the tabbing ribbon to a certain length needed for connecting the solar cells, where the size of the wheel or roller corresponds to the needed length of the tabbing ribbon.

In various embodiments, the non-planar sections are formed by means of a molding press.

In various embodiments, the molding press may include a device e.g. a blade for cutting the tabbing ribbon to a certain length needed for connecting the solar cells, where the size of the molding press corresponds to the needed length of the tabbing ribbon.

In various embodiments, a machine for manufacturing a solar cell tabbing ribbon is provided. The machine may include a device configured to form non-planar sections into the tabbing ribbon.

In various embodiments, the device may include two large toothed rolls or a plurality of toothed wheels which are arranged relative to each other such that a plurality of solar cell tabbing ribbons or one solar cell tabbing ribbon per toothed wheel being moved between the toothed rolls or toothed wheels is shaped according to the tooth form.

In various embodiments, the device may include one large press mold or a plurality of press molds which are arranged relative to each other such that a plurality of solar cell tabbing ribbons or one solar cell tabbing ribbon per each press mold being arranged between the press molds and are shaped according to the mold form.

In various embodiments, the device to shape the solar cell tabbing ribbon may be configured such that the non-planar sections are formed with a shape axis different from 90° angle to main extension of tabbing ribbon.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A tabbing ribbon for connecting to at least one solar cell,
   wherein at least a portion of the tabbing ribbon comprises a non-planar section;
   wherein the non: planar section comprises lower portions and higher portions;
   wherein the lower portions are configured to contact with a surface of the at least one solar cell; and
   wherein the shape axis of the non-planar section is different from 90° angle to a main extension of the tabbing ribbon for reflecting light from the tabbing ribbon via total reflection at a cover plane of a solar panel comprising the solar cell, to the solar cell.

2. The tabbing ribbon of claim 1,
   wherein the tabbing ribbon at least partially extends in a meander-like shape.

3. The tabbing ribbon of claim 1,
   wherein the higher portions are configured to not to be contacted to the surface of the solar cell to be connected.

4. The tabbing ribbon of claim 1,
   wherein the non-planar section is formed in accordance with one of the following shapes: sinusoidal, half-circle, half-wave, trapeze, rectangular or triangular shape or any combination of previous mentioned shapes or between the previous mentioned shapes.

5. The tabbing ribbon of claim 1,
   wherein the shape axis is at angle α to the main extension direction of the tabbing ribbon is determined in accordance with $$\alpha > \arcsin\left(\frac{b}{2d}\right),$$

wherein b denotes the width of the tabbing ribbon, and wherein d denotes a distance between the surface of a solar cell connected to the tabbing ribbon and the cover plane of the solar panel comprising the solar cell with the tabbing ribbon.

6. The tabbing ribbon of claim 1,
wherein the tabbing ribbon is made of a metal or is covered with a metal.

7. The tabbing ribbon of claim 6,
wherein the tabbing ribbon is made of a metal or is covered with a metal selected from a group of metals consisting of copper; nickel; aluminum; tin; lead; zinc; bismuth; and silver; and any alloy of these metals.

8. A photovoltaic solar panel, comprising:
at least one solar cell; and
a tabbing ribbon,
  wherein at least a portion of the tabbing ribbon comprises a non-planar section;
  wherein the non-planar section comprises lower portions and higher portions;
  wherein the lower portions are configured to contact with a surface of the at least one solar cell;
  wherein the shape axis of the non-planar section is different from 90° angle to a main extension of the tabbing ribbon for reflecting light from the tabbing ribbon via total reflection at a cover plane of a solar panel comprising the solar cell, to the solar cell; and
wherein the tabbing ribbon electrically connects to the at least one solar cell.

9. The photovoltaic solar panel of claim 8,
wherein the non-planar section of the tabbing ribbon is electrically connected to the light receiving surface of the at least one solar cell and the backside of another solar cell.

10. The photovoltaic solar panel of claim 8,
wherein the tabbing ribbon is connected to the at least one solar cell by means of solder or by means of conductive adhesive.

\* \* \* \* \*